(12) United States Patent
Blodgett

(10) Patent No.: US 9,176,800 B2
(45) Date of Patent: Nov. 3, 2015

(54) MEMORY REFRESH METHODS AND APPARATUSES

(75) Inventor: Greg A. Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 297 days.

(21) Appl. No.: 13/222,282

(22) Filed: Aug. 31, 2011

(65) Prior Publication Data

US 2013/0055046 A1 Feb. 28, 2013

(51) Int. Cl.
| | |
|---|---|
| G11C 29/00 | (2006.01) |
| G06F 11/07 | (2006.01) |
| G06F 11/10 | (2006.01) |
| G06F 11/14 | (2006.01) |
| G11C 16/34 | (2006.01) |

(52) U.S. Cl.
CPC .......... *G06F 11/0727* (2013.01); *G06F 11/073* (2013.01); *G06F 11/076* (2013.01); *G06F 11/0793* (2013.01); *G06F 11/106* (2013.01); *G06F 11/1417* (2013.01); *G11C 16/3418* (2013.01)

(58) Field of Classification Search
CPC .............. G06F 11/106; G06F 11/1417; G06F 11/0727; G06F 11/076; G06F 11/0793; G06F 11/073; G11C 16/3418
USPC .................................. 714/764, 746
See application file for complete search history.

(56) References Cited

U.S. PATENT DOCUMENTS

| | | | |
|---|---|---|---|
| 7,325,090 B2 | 1/2008 | Ronen | |
| 2004/0257888 A1 | 12/2004 | Noguchi et al. | |
| 2005/0108491 A1* | 5/2005 | Wong et al. | 711/167 |
| 2007/0104004 A1 | 5/2007 | So et al. | |
| 2008/0055989 A1 | 3/2008 | Lee et al. | |
| 2008/0270776 A1* | 10/2008 | Totolos et al. | 713/1 |
| 2009/0024904 A1 | 1/2009 | Roohparvar et al. | |
| 2009/0031194 A1* | 1/2009 | Bellipaddy et al. | 714/764 |
| 2009/0327581 A1 | 12/2009 | Coulson | |
| 2010/0165689 A1 | 7/2010 | Rotbard et al. | |
| 2010/0169750 A1 | 7/2010 | Chew et al. | |

FOREIGN PATENT DOCUMENTS

| | | |
|---|---|---|
| JP | 0827925 A | 10/1996 |
| JP | 09204367 A | 8/1997 |
| JP | 2004326867 A | 11/2004 |
| JP | 2008090778 A | 4/2008 |
| JP | 2009087509 A | 4/2009 |
| JP | 2010015191 A | 1/2010 |

(Continued)

OTHER PUBLICATIONS

"International Application Serial No. PCT/US2012/052687, International Search Report mailed Feb. 21, 2013", 3 pgs.
"International Application Serial No. PCT/US2012/052687, Written Opinion mailed Feb. 21, 2013", 8 pgs.

(Continued)

*Primary Examiner* — Guy Lamarre
(74) *Attorney, Agent, or Firm* — Schwegman Lundberg & Woessner, P.A.

(57) ABSTRACT

Apparatuses and memory refresh methods are disclosed, such as those involving checking a portion of a memory device for errors in response to the memory device being powered on, and reprogramming corrected data to the memory device if errors are found in checking the portion of the nonvolatile memory for errors. Other apparatuses and memory refresh methods are disclosed.

46 Claims, 6 Drawing Sheets

(56) References Cited

FOREIGN PATENT DOCUMENTS

| JP | 2010067010 A | 3/2010 |
|---|---|---|
| JP | 2011128751 A | 6/2011 |
| KR | 20110026578 A | 3/2011 |
| WO | WO-2009044904 A2 | 4/2009 |
| WO | WO-2010054670 A1 | 5/2010 |
| WO | WO-2013033107 A2 | 3/2013 |
| WO | WO-2013033107 A3 | 3/2013 |

OTHER PUBLICATIONS

"European Application Serial No. 12826784.6, Extended European Search Report mailed Nov. 27, 2014", 6 pgs.

"International Application Serial No. PCT/US2012/052687, International Preliminary Report on Patentability mailed Mar. 13, 2014", 10 pgs.

"Japanese Application Serial No. 2014-528524, Office Action mailed Sep. 1, 2015", W/ English Translation, 9 pgs.

* cited by examiner

MEMORY REFRESH METHODS AND APPARATUSES

BACKGROUND

A variety of computer systems and electronic devices use memory that is not volatile. In other words, the memory does not lose stored data when power is disconnected. These nonvolatile memories can be reprogrammed, read, and erased electronically, and are well-suited to store a variety of data such as music in digital audio players, pictures in digital cameras, and configuration data in cellular telephones. Such memory includes devices commonly known as flash memory, named in part because a flash operation is used to erase the content of a block of memory cells before it is reprogrammed. This type of memory is often packaged for consumer use in products such as CompactFlash memory cards, USB flash memory drives, and other such devices.

Flash memory typically comprises a number of cells, each programmable to one of at least two data states, where each data state can represent a data value such as a digit (e.g., a bit) or digits of data. A typical flash memory cell comprises a field effect transistor having an electrically isolated charge storage structure such as a floating gate or charge trap that controls electrical conduction between source and drain regions of the memory cell. Data is represented by a charge stored on the charge storage structure, and the resulting change in conductivity observed between the source and drain regions.

The charge storage structure separates a control gate from the source and drain regions of the memory cell. Electrons stored on the charge storage structure are electrically insulated from the control gate and the drain and source by a dielectric material, such as a tunnel oxide. When the memory cell is read by placing a specified voltage on the control gate, the electrical impedance between the source and drain of the device will either allow or not allow current to flow, depending on the effective threshold voltage (Vt) of the memory cell. The stored charge partially cancels out or modifies an electric field produced by the control gate, resulting in a change in the effective threshold voltage (Vt) of the memory cell. The presence or absence of current in response to a particular voltage applied to the control gate can be sensed and used to determine whether the memory cell is in a particular data state representing a particular data value, such as a one or zero value.

Some flash memory cells can be programmed to one of three or more data states, and are often referred to as multi-level memory cells. For example, a multi-level memory cell that can be programmed to any of four states can store two bits of data per cell, thereby doubling the amount of data that can be stored relative to a conventional single-bit memory cell.

Memory cells are typically arranged in a two-dimensional array of rows and columns, where the memory cells in a row are coupled via an access line, often called a wordline, and the memory cells in a column are coupled to a data line, often called a bitline. The wordlines and bitlines are used during data read and program functions to either select certain memory cells for reading or to select certain memory cells for programming (which is sometimes referred to as "writing").

Memory cells are susceptible to a variety of factors that can influence accuracy of stored data, such as cosmic rays, read-induced interference, and other factors that can alter the charge stored on the charge storage structure of a flash memory cell. Induced electric or magnetic fields, capacitive coupling, and finite resistance of the conductors and insulators can also cause unwanted coupling or interference between bitlines and wordlines.

Any of these factors can reduce the accuracy of reading a memory cell. Factors such as these can be even more significant in multi-level memories having more than two possible data states per memory cell, as the difference between adjacent data states becomes more difficult to accurately discern as the number of possible data states increases.

DETAILED DESCRIPTION

In the following detailed description of example embodiments of the invention, reference is made to specific example embodiments of the invention by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit other embodiments of the invention or the invention as a whole, and any reference to the invention, its elements, operation, and application do not limit the invention as a whole but serve only to define these example embodiments. The following detailed description does not, therefore, limit the scope of the various embodiments of the invention, which is defined only by the appended claims.

Figure 1:
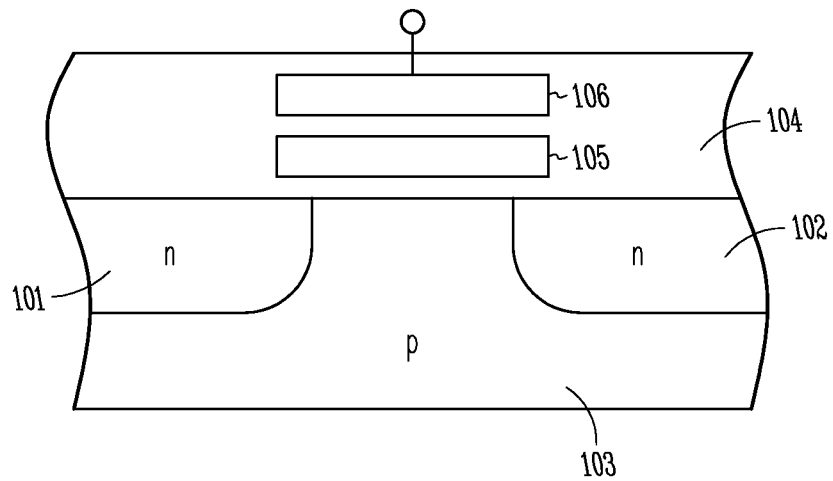
FIG. 1 is a cross-section view of a nonvolatile memory cell, as may be used to practice some embodiments of the invention.

FIG. 1 illustrates an example nonvolatile memory cell. A source 101 and drain 102 are formed on a substrate 103, such as a p-type semiconductor material. The source 101, drain 102, and substrate 103 are in some embodiments formed of silicon, with a dopant having five valence electrons such as phosphorous, arsenic, or antimony to increase the electron concentration in the silicon or with a dopant having three valence electrons such as boron, gallium, indium, or aluminum to increase the hole concentration. Dopants are typically added in small, controlled quantities to produce the desired hole or electron concentration in the semiconductor material, resulting in n-type material if a surplus of electrons are present, such as in the source 101 and drain 102, and resulting in p-type material if an excess of holes are present such as in the substrate material 103.

An insulator material such as silicon oxide (SiO2) is used to form an insulating layer 104, which has embedded within it a charge storage structure such as a floating gate 105, fabricated from a conductor such as metal or conductive polysilicon, or a charge trap (e.g., formed from a nitride material). A control gate 106 is similarly formed of a conductive material. The floating gate 105 is not directly electrically coupled to another conductive element of the memory cell, but is "floating" in the insulating material 104. The floating gate 105 is separated from the region of the p-type substrate material 103 between the source 101 and the drain 102 by a thin (e.g. ten nanometer) portion of the insulating layer 104, such as a tunnel dielectric portion of the insulating layer 104 (e.g., silicon dioxide (SiO2) and/or a combination of an oxide, a nitride, and an oxide (ONO).

In operation, the charge storage structure 105 is able to store a charge due to its electrical isolation from other components of the memory cell. Programming or erasing a charge level on the charge storage structure 105 can be performed via a tunneling process known as Fowler-Nordheim tunneling, in which electrons tunnel through the portion of dielectric material 104 separating the charge storage structure 105 from the substrate 103. The portion of the dielectric material or materials separating the charge storage structure 105 from the substrate 103 are conventionally referred to as the tunnel dielectric.

Most flash memory devices are categorized as either NOR flash or NAND flash, based on the arrangement of the memory cells or the circuitry used to perform read, program, and erase operations.

In one example of programming a memory cell in a NOR flash memory, the source 101 can be grounded and a supply voltage such as six volts can be applied to the drain 102. In one embodiment, the drain voltage is applied via a bitline used to identify the memory cell to be programmed. A higher voltage such as 12 volts is also placed on the control gate 106 of the memory cell, forcing an inversion region to form in the p-type substrate due to the attraction of electrons to the positively charged control gate. The voltage difference between the source and drain in combination with the inversion region in the p-type material result in significant electron flow between the source 101 and drain 102 through the p-type substrate 103's inversion region, such that the kinetic energy of the electrons and the electric field generated by the control gate voltage at 106 result in Fowler-Nordheim tunneling of high-energy (also known as "hot") electrons across the tunnel dielectric and onto the charge storage structure 105.

The charge storage structure thereby adopts a negative charge that counteracts any control gate positive charge's effect on the region of the substrate 103 between the source 101 and drain 102, raising the voltage that must be applied to the control gate 106 via a wordline to result in conduction across an inversion region in the p-type substrate material 103. In other words, when the wordline's voltage is brought to a high voltage (such as five volts) during a read operation, the cell will not turn on due to the higher threshold voltage as a result of electrons stored on the charge storage structure 105 during the program operation. The read voltage applied to the control gate is larger than the threshold voltage Vt of an erased memory cell, but not large enough to allow conduction across an inversion region in the substrate 103 of a cell that has been programmed.

In one example of programming a memory cell in a NAND flash, the source 101 and drain 102 of the memory cell of FIG. 1 can be grounded, and the control gate 106 can be brought to a voltage of perhaps 20 volts. This voltage is significantly higher than the 12 volt control gate voltage used to program the same memory cell using NOR flash methods, because a higher voltage makes up for the absence of "hot" electrons slowing between the source and drain of the memory cell.

In an example of erasing a memory cell using NOR flash memory circuitry, a similar tunneling of electrons can take place from the charge storage structure 105 to the source 101 of the memory cell. The source 101 is in some embodiments more deeply diffused than the drain to enhance erase performance. A positive voltage (such as twelve volts) can be applied to the source 101, the control gate 106 can be grounded, and the drain 102 can be left disconnected to perform an erase operation in one example. The large positive voltage on the source 101 attracts negatively charged electrons, causing them to tunnel through the insulating layer 104 and leave the floating gate 105. Because there is very little current flow between the source 101 and drain 102 during an erase operation, performing an erase operation takes very little current and consumes relatively little power.

In another example memory cell erase operation in NAND memory configurations, the source 101 and drain 102 can be left floating, but the substrate material 103 is brought to a high positive voltage (such as 20 volts), attracting the negatively charged electrons and causing them to tunnel from the charge storage structure 105 through the oxide insulating layer 104 to the substrate material 103. This method is sometimes known as "channel erase", because the channel region in substrate material 103 receives electrons from the charge storage structure 105.

Figure 2:
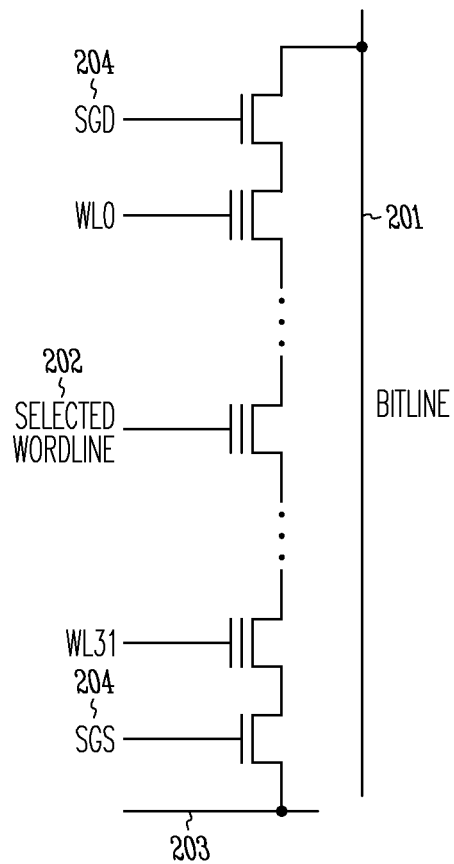
FIG. 2 is a schematic diagram of a string of nonvolatile memory cells in a NAND flash memory configuration, consistent with some embodiments of the invention.

Memory cells such as that shown in FIG. 1 can be arranged in arrays that are addressed via access lines known as wordlines, and data lines known as bitlines, as shown in FIG. 2. FIG. 2 shows a portion of a NAND flash memory array including a string of memory cells that can be selectively coupled to a single bitline, where each of the memory cells shown in the string is further selectable via a wordline 202.

The string of memory cells 0-31 can be selectively coupled on the other side of the string to source line 203. The string can be coupled to (or isolated from) the bit line 201 and the source line 203 by operation of respective select transistors 204. To perform a read operation of a selected single-level memory cell 202 in one example, the word line and therefore the control gate of the selected memory cell 202 can be maintained at a low but positive voltage level while the word lines of unselected memory cells can be brought to a sufficiently high voltage to cause the unselected memory cells to conduct irrespective of any charge that may be on the charge storage structures of the individual memory cells. If the selected memory cell has an uncharged charge storage structure it will conduct as a result of the low positive voltage level on the control gate, but if the charge storage structure has a negative charge it will raise the threshold voltage of the memory cell 202 above the low positive voltage applied to the control gate such that the cell does not conduct. The data state of the memory cell's charge storage structure can therefore be determined by, for example, monitoring conductivity or current flow between the bitline 201 and source line 203.

To program a selected memory cell 202 in one example, the bitline 201 and source line 203 can be grounded via line select transistors 204 coupling the string to a grounded bitline 201 and source line 203. The gates of select transistors 204 are therefore again coupled to a voltage source such that the transistors conduct. The control gates of the memory cells not being programmed are brought to a sufficiently high voltage (e.g., ten volts) to inhibit inadvertent programming of those memory cells. The selected memory cell 202's control gate is coupled to a significantly higher voltage, such as 20 volts, such that electrons tunnel onto the charge storage structure.

Outside factors such as cosmic rays, program-induced disturbance, and read-induced disturbance can however cause the stored charge to change over time, resulting in variation in threshold voltage Vt of the programmed memory cells that can cause read errors and other negative effects.

Figure 3:
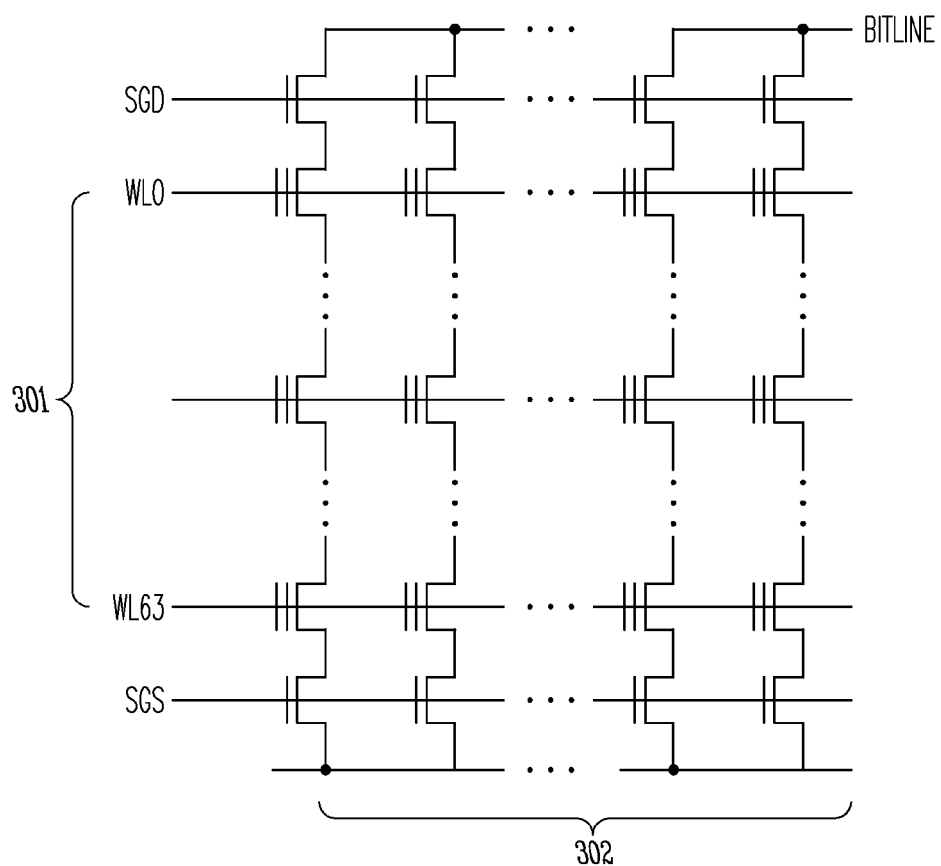
FIG. 3 is a schematic diagram of a block of NAND flash nonvolatile memory, consistent with some embodiments of the invention.

Strings of memory cells such as those of FIG. 2 can be organized in blocks, such that a block is the smallest erasable unit of flash memory. FIG. 3 shows a block of NAND flash memory, as may be used to practice some embodiments of the invention. Here, 64 separate word lines shown at 301 provide 64 separately addressable physical pages of memory in the block, with each page capable of storing 4096 bytes of user data and 128 bytes of overhead data (sometimes referred to as spare bits), such as error correction code (ECC) data. ECC Data can be used to detect and/or correct some memory errors. In this example embodiment, the block can therefore store 256 kB of user data plus 8 kB of overhead data. A conventional flash memory device contains many such blocks, for example a 1024 block memory device providing 256 MB of user data storage.

Figure 4:
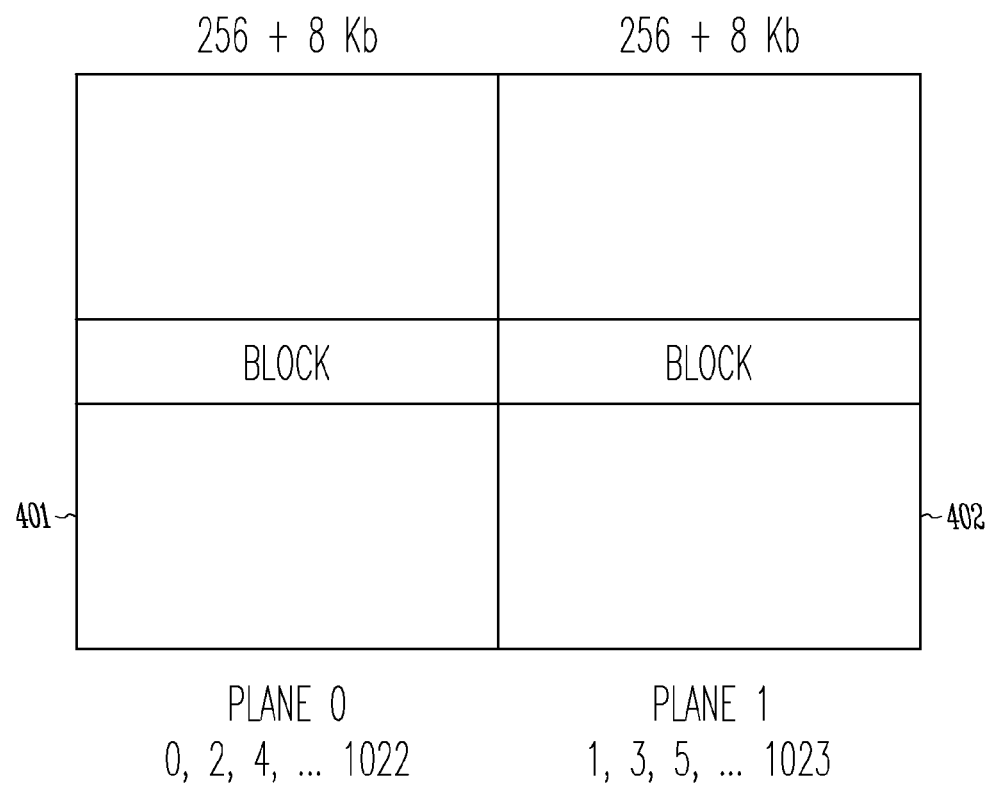
FIG. 4 is a block diagram of a nonvolatile memory, consistent with some embodiments of the invention.

A more detailed example of such a memory device is shown in FIG. 4, which illustrates multiple planes of blocks such as the block shown in FIG. 3, as may be used to practice some embodiments of the invention. Here, plane 0 as shown at 401 contains even-numbered blocks of memory, while plane 1 shown at 402 contains odd-numbered blocks of memory, for a total of 1024 blocks. Dividing the memory into two or more planes can provide faster memory operation, but may restrict memory operations to reading, programming, and erasing even and odd-numbered planes at the same time. For example, an erase operation performed on block 0 of plane 0 could also include erasing block 1 of plane 1, and programming a page to block 1022 of plane 0 could result in also programming the corresponding page in block 1023 of plane 1.

Because the programming operation and read operation are similar in that they involve applying a voltage to the memory cells being written in a write operation or non-selected cells in a memory cell string in a read operation, multiple read, program, and/or erase operations can eventually affect the data state of a programmed memory cell. For example, a conventional NAND flash memory can have the data states of its programmed memory cells corrupted after tens or hundreds of thousands of reads per page.

Although some errors can be corrected using the error correction data stored in the memory, it can be desirable to limit the number of read errors that occur to provide for more reliable and efficient memory operation, and to prevent multi-bit or other unrecoverable errors. For example, a memory block of 64 pages as shown in FIG. 3 may have millions of read operations performed on the block to read the first 63 pages before the $64^{th}$ page is read, resulting in a significant chance of irrecoverable read errors on the $64^{th}$ page.

Some embodiments of the invention therefore seek to reduce the occurrence of memory errors by refreshing the memory (e.g. copying and reprogramming) over time to prevent corruption or loss of the stored data. Refreshing the memory can be performed as a result of factors such as the passage of time since programming, exceeding a read error threshold, or powering on the memory device or memory controller (either directly, or indirectly such as by powering on a memory controller coupled to the memory device).

In a more detailed example embodiment, a memory controller reads through memory systematically to detect blocks with levels of memory errors that exceed a certain threshold, and refreshes the blocks before the errors become irrecoverable. Because it can be desirable to limit the number of times a memory cell is programmed, unnecessary programming can be avoided by not refreshing data if the minimum error threshold is not exceeded. For example, if error correction data enables correction of 24 bits in a page, a block might only be refreshed if half of the correctable bits (12 bits in this example) are found to be in error in a page read operation performed on the block.

Some devices such as portable game systems, smart phones, portable media devices, and other such devices are power cycled (i.e. powered on and powered off) relatively frequently, reducing the ability of the device to scan through all memory and manage potential read errors effectively. Some embodiments of the invention therefore use power cycling to manage errors in a nonvolatile memory, such as by using power cycles to trigger memory scan and refresh operations and performing these operations on a fine-grained level.

The impact of a single memory scan and refresh operation can be minimized in one example by scanning and refreshing on a block level, such that copying and reprogramming of perhaps megabytes of data stored in a single block can be completed in, for example, hundreds of milliseconds. In a further example, at least one different block is scanned in response to each power on, ensuring that blocks of memory are scanned and refreshed if needed on a regular basis.

During device operation, scanning can continue on a block-by-block basis as a background task, and any necessary refreshes are queued to be completed as part of the background task or as a part of the next power cycle of the device. If power is lost, the device restart process in one example includes determining whether a block of memory from the device is already marked for refresh (e.g. such as when refreshing a block marked for refresh was not completed before power was lost). This method can be supplemented by a tracking mechanism in a further example, which tracks reads performed on each block and checks several pages of the block for errors periodically (e.g. every thousand reads).

The identity of the current block being checked for errors can be stored in nonvolatile memory, such as in a register or in a portion of the memory array itself, and can be used to ensure that block checks triggered by power cycling or performed as a background task proceed through all of the memory rather than restarting at the same block for each power cycle. Refreshing can be further tracked across power cycling by marking blocks for refresh, such that queued or incomplete block refreshes can be completed as part of a power on sequence or during device operation after a power on sequence completes. In a further example, nonvolatile memory can also store the number of page reads per device or block, enabling a device that reboots frequently to count accumulated read operations across power cycles rather than lose count of page reads when a device is powered off.

Figure 5:
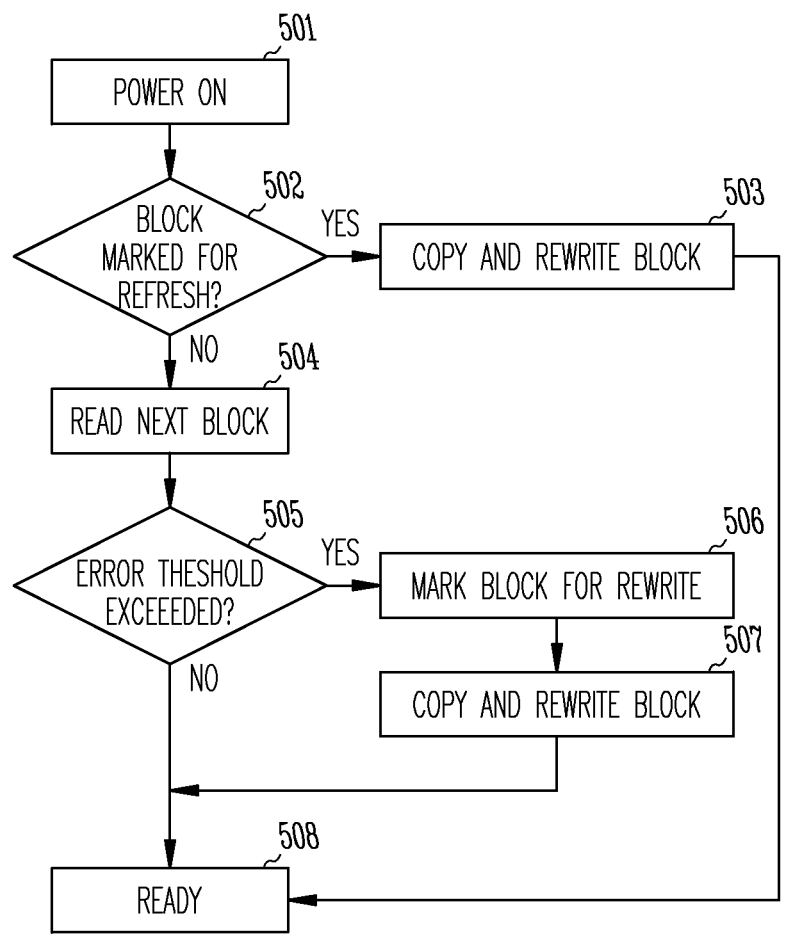
FIG. 5 is a flowchart illustrating a method of power cycle-based nonvolatile memory refresh, consistent with some embodiments of the invention.

FIG. 5 is a flowchart illustrating a method of managing memory errors triggered by a power on sequence, consistent with an example embodiment of the invention. At 501, a device is powered on and starts a power-on sequence, including determining whether any blocks of memory are already marked for refresh, such as by checking a nonvolatile memory location (e.g., a register) for block information, or by checking flags associated with memory blocks. If a memory block is marked in some way for refresh at 502, the data stored in the block is copied and reprogrammed at 503.

If no block is marked for refresh at 502, an identified block of memory is read at 504. In some embodiments, the memory block is identified by looking up a pointer to a next unchecked memory block in a power cycle-based memory refresh, so that the method proceeds through memory across power cycles rather than restarting with the same memory block at each power on sequence.

As the block is read, the number of errors per page are counted using ECC, and it is determined whether the number of errors exceed a threshold at 505. In one further example, a memory that can correct up to 24 bits per page using stored ECC data exceeds its acceptable number of errors if 12 bits (e.g. approximately half the correctable number of bits) in any page of the block are in error and need to be corrected. Other thresholds, such as one third the number of correctable bits, can be used in other embodiments. Thresholds can vary based on factors such as the number of operations implemented in the life of the memory, or the age of the memory.

If the number of errors exceeds the allowable threshold for read errors at 505, the block is marked for refresh at 506. The data of the block is then copied, error correction code data is used to fix the correctable errors, and the data is reprogrammed at 507. The block can be marked for refresh before copying and reprogramming so that if the device is powered off or the method is otherwise interrupted before copying and reprogramming can complete at 507, the data of the block will still be copied and reprogrammed (such as at 502 and 503) when the device is powered on again. The flag marking the block for refresh at 506 is therefore not cleared in this example until the copying and reprogramming at 507 are complete.

At 508, the memory is ready for normal operation. In some embodiments, the copying and reprogramming at 503 that is performed if a memory block is marked for refresh on power on does not result in a ready state when complete, but instead proceeds to 504 where at least one new block is read before the memory device becomes ready, which can ensure that at least one new block is read on each normal power cycle.

The method illustrated in FIG. 5 can be used to ensure that at least one block is checked or refreshed on each power cycle, but can be configured such that only one block will be refreshed as part of the power on cycle. Although reading a typical block currently takes on the order of a millisecond using some technologies, reprogramming the block can currently take on the order of hundreds of milliseconds, so reprogramming several blocks could significantly delay memory availability during the power on sequence. Some standards such as the JEDEC Flash Memory standards require that memory be ready for operation within a certain time period after power on, such as within one second. For this reason, some embodiments such as the example shown in FIG. 5 can limit the number of programming operations that occur as part of the device startup method, such as by ensuring that only one block is reprogrammed before the memory becomes ready for regular access operations.

Figure 6:
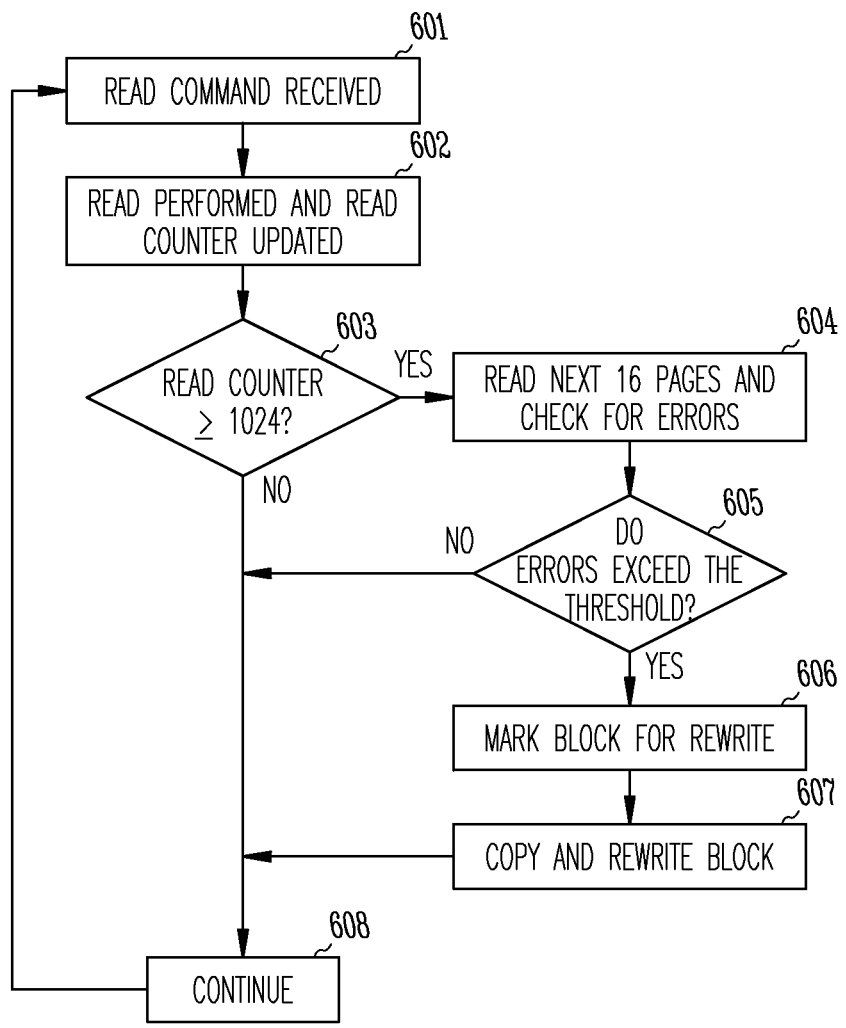
FIG. 6 is a flowchart illustrating a method of background nonvolatile memory refresh, consistent with some embodiments of the invention.

The power on refresh method of FIG. 5 can be supplemented in a further example by a background memory refresh method, as shown in FIG. 6. According to one such example method, a read is performed after receiving a read command, at 601, and a read counter is updated at 602 (e.g., by incrementing an up-counter or decrementing a down-counter). Because a read command can result in multiple pages being read, the counter can count a number of pages read rather than read commands, such as to ensure that an accurate count of the number of times a page has been read can be maintained. When the number of pages read reaches a threshold (e.g. the number of page reads reaches 1024 pages as illustrated at 603), a refresh scan is initiated. For example, at 604, a particular number of pages (e.g. 16 pages) of a block of memory identified by a refresh block pointer are read and checked for errors at 604. In other embodiments, other suitable read thresholds and numbers of pages to be read will be used.

If any of the 16 pages of data read at 604 include a number of errors that exceed the threshold (i.e., a predetermined allowable error rate), such as 12 or more errors in a page where the ECC can correct up to 24 bits in the page, the block identified by the refresh block pointer is marked for refresh at 606. The data of the block is then read and copied (e.g., into a buffer memory) for reprogramming (e.g., page by page) as shown at 607, such as to update the data stored in memory with corrected and freshly programmed data. When the data of the block has been successfully reprogrammed, the flag indicating the block is to be reprogrammed is cleared. The block copy and reprogram can therefore be repeated at the next power cycle if it does not complete successfully before the next power cycle occurs, as the flag indicating the block is to be reprogrammed will still be set.

The background refresh method then continues at 608, with the page read counter being reset (e.g., to zero). In some embodiments, the threshold of pages read can be based on factors such as read disturb testing on a particular memory configuration, memory device density, and other such factors.

In this example, when a block is marked for refresh at 606, no further pages in the block need be read as part of the refresh scan as the entire block will be copied. In some embodiments, the data of the block is relocated to another block location in physical memory as part of a wear-leveling method, reducing further wear on a physical block of memory already determined to have an unacceptable read error rate.

The block refresh method at 606-607 in this example completes before further refresh scan reads occur at 604, to prevent accumulation of blocks marked for refresh. In another embodiment, the method illustrated in FIG. 6 operates such that only one block at the most is marked for refresh at any one time.

The current block and page being read as part of the refresh scan method are stored in memory, which in some embodiments comprises a nonvolatile memory. The memory location of the background refresh method is therefore not lost during a power cycle. In a further example, only the block location of the background refresh method is stored in nonvolatile memory as it is updated relatively infrequently, and the page location pointing to the particular 16 pages of the block to scan, as reflected at 604, is stored in volatile memory (such as random access memory or RAM). Should the device undergo a power cycle, the background refresh method will restart at the beginning of the block marked in the nonvolatile memory, repeating scanning of at most a portion of the block before scanning the remaining portion of the block and proceeding to nonvolatile memory that the background refresh process has not recently scanned.

Error threshold level, rate of refresh, and other such parameters can be selected in a further embodiment to avoid under-refresh or over-refresh of the device. Although it is often undesirable to allow errors to accumulate to the point where an uncorrectable read error may occur, it is also often undesirable to refresh nonvolatile memory too frequently, as unnecessary wear on the nonvolatile memory cells can result in, for example, a shortened lifespan of the memory device.

The rate of refresh can also be chosen to reduce the chances of an uncorrectable read disturb error occurring before a page can be refreshed. Consider as an example a nonvolatile memory having 1024 total blocks and 256 pages per block. If 100,000 reads per page in a block are needed for a read disturb in that block to become reasonably possible, 100,000 reads per page times 256 pages per block results in approximately 26 million reads in the block for a read disturb event to become reasonably possible. 26 million reads per block divided by 1024 blocks suggests that one block should be refreshed every 26,000 page reads to make a read disturb error reasonably unlikely. Refreshing at a faster rate, such as one block every 16,000 page reads provides some extra margin of safety.

As previously discussed, the time taken to perform a read can also be a factor in choosing refresh parameters that will suit a particular application. Reading an entire block at one time as part of a background refresh method can currently take about 100 milliseconds, which may be acceptable at power-on but undesirable during operation. Reading a single page at a time for a refresh scan can currently take about a millisecond, but might be performed every 64 user page reads in the above example with one block refreshed per 16,000 user page reads. Similarly, reading 16 pages for a refresh scan currently takes approximately 8 milliseconds, and might be performed every 1024 user page reads to refresh an entire block every 16,000 user page reads.

Reading and programming a block currently takes approximately 500 milliseconds, so the combined total time to read a block to check for errors and then read and reprogram the block in this example is approximately 600 milliseconds. If 16 pages are read for a refresh scan every 1024 user page reads, the total impact on the user would be approximately 8 ms delay every 1024 pages read, plus approximately 2-3 ms to update the active block address in nonvolatile memory as scanning each block is completed. In the rare event a refresh is needed, an additional 500 ms delay will occur to copy and reprogram the block. As this is expected to be an uncommon occurrence in most real-world applications and is preferable to an irrecoverable read-induced memory error, the half-second delay should be acceptable for most applications. For applications that cannot tolerate a 500 ms delay, the refresh of the block can be split into multiple operations. For example, 16 operations of reprogramming 16 pages will copy a 256 page block over time, while causing only about a 32 ms delay maximum to any one system memory access. In another example, the memory device may allow for a normal memory access to interrupt a block copy, perform the normal access, and then resume the copy to provide minimum delay to normal operations.

Figure 7:
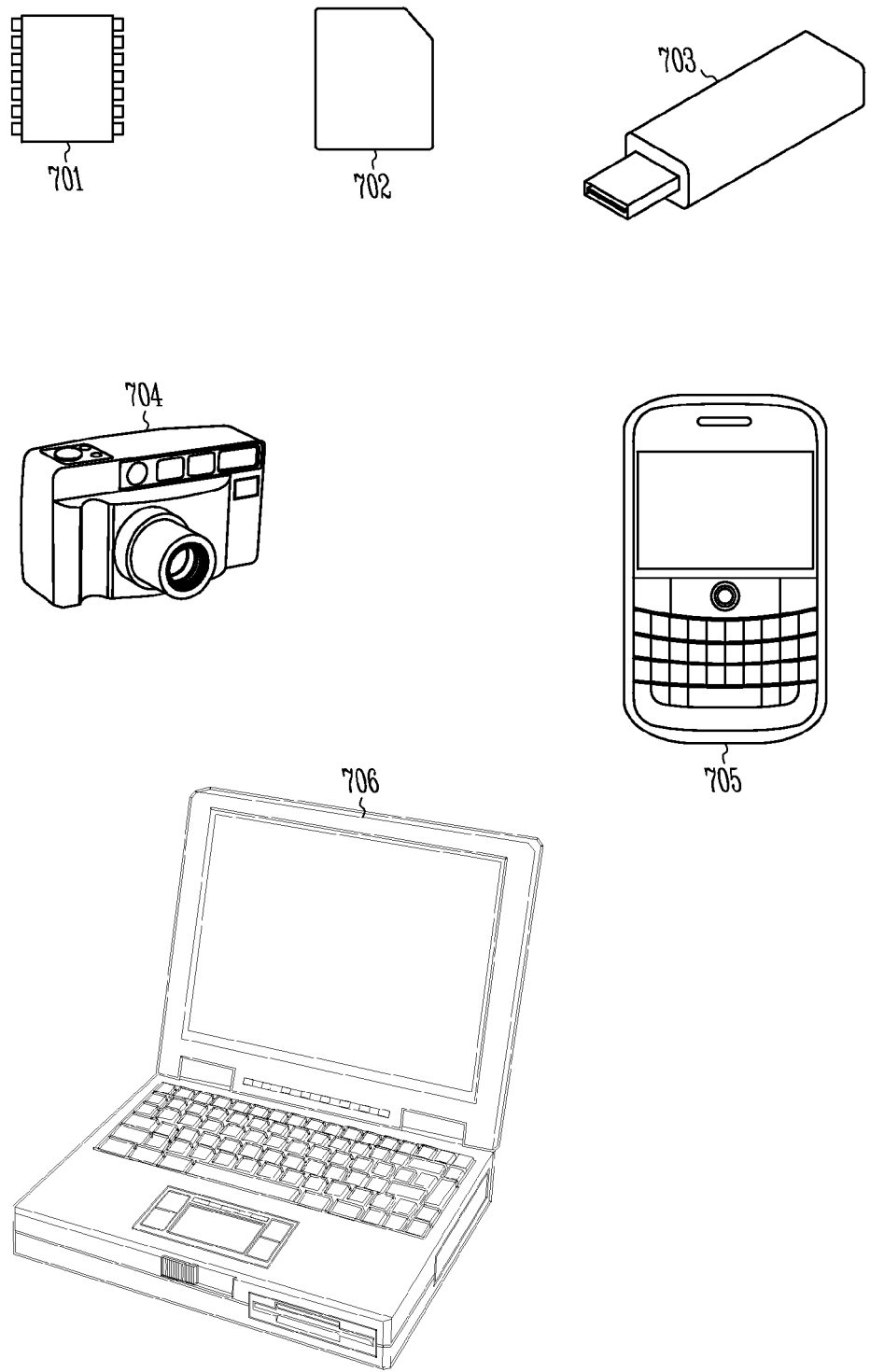
FIG. 7 shows a variety of devices operable to employ nonvolatile memory refresh methods, consistent with some embodiments of the invention.

The refresh methods described herein in some embodiments are managed by a memory controller that is integral to a memory device, such as one that forms a part of a flash memory card, and in other embodiments are implemented external to a memory device, such that the methods described above can be employed with off-the-shelf nonvolatile memory devices. FIG. 7 shows a variety of devices operable to employ methods such as those described herein.

At 701 is a nonvolatile memory integrated circuit, such as a flash memory integrated circuit. In some embodiments the integrated circuit includes an integral controller, while in other embodiments an external memory controller performs memory refresh operations. A flash memory card is similarly shown at 702 (e.g., a secure digital (SD) memory card), which again may include an integral controller or may be refreshed by an external controller (e.g., as embodied in hardware, firmware, and/or software).

A flash memory drive, often known as a thumb drive or USB flash drive is shown at 703, often employing large amounts of portable, nonvolatile memory ranging into tens of gigabytes and more. Consumers often use such drives to store and carry data between computers, such as saved documents, multimedia files, and the like. A digital camera is shown at 704, which often includes both internal flash memory for storing firmware and other data as well as a flash memory card (such as shown at 702) for storing photographs, video, and other data.

Refresh methods such as those described herein are also useful in smart phones, portable gaming systems, personal digital assistants (PDAs), or other such devices as shown at 705. These devices use nonvolatile memory such as flash memory to store programs and other data. Nonvolatile memory is also becoming increasingly common as a high-performance option in personal computers as shown at 706, both for storing data such as firmware and configuration data, as well as in solid-state drives (SSD). Because solid-state drives outperform typical hard disk drives by a significant margin, use of solid state drives can improve computer responsiveness and speed, making tasks such as booting, launching an application, or restoring from a hibernate state much quicker for the end user.

These electronic memory devices of FIG. 7 illustrate environments in which the refresh methods described herein can provide improved memory reliability and data integrity, particularly when the devices shown are susceptible to frequent power cycles. Although specific embodiments have been illustrated and described herein, it will be appreciated by those of ordinary skill in the art that any arrangement that achieve the same purpose, structure, or function may be substituted for the specific embodiments shown. This application is intended to cover any adaptations or variations of the embodiments of the invention described herein. It is intended that this invention be limited only by the claims, and the full scope of equivalents thereof.

The invention claimed is:

1. A method, comprising:
   checking a portion of non-volatile memory of a non-volatile memory device for errors in response to the memory device being powered on, wherein a different portion of the memory is checked for errors in response to each power on;
   checking additional portions of the memory for errors, during operation of the memory, after a predetermined number of pages of the memory have been read wherein the predetermined number of pages is a total number of pages accumulated over a plurality of power cycles; and
   reprogramming corrected data to the memory if errors are found.

2. The method of claim 1, wherein the portions of the memory checked for errors comprises a block or less of the memory.

3. The method of claim 1, wherein checking the portions of memory for errors comprises determining whether any portion of the memory is already marked for refresh upon powering on the memory device.

4. The method of claim 3, further comprising refreshing the portions of the memory if it is determined that the portions are already marked.

5. The method of claim 1, wherein checking the portions of memory for errors comprises reading the portions of the memory and using an error correction code to determine the presence of errors.

6. The method of claim 1, wherein reprogramming corrected data to the memory if errors are found comprises reprogramming corrected data only if the errors found exceed an error threshold.

7. The method of claim 1, further comprising maintaining a refresh block pointer identifying a memory block to be checked for read errors.

8. The method of claim 1, wherein reprogramming corrected data to the memory comprises marking the portion of the memory for refresh, copying data of the portion of the memory, reprogramming the copied data, and unmarking the portion of the memory.

9. An apparatus, comprising:
an array of non-volatile memory cells; and
a controller operable to check a portion of the memory cells for errors in response to at least a portion of the apparatus being powered on, and reprogram corrected data to the memory cells if errors are found, the controller being further operable to check additional portions of the memory cells for errors, during operation of the memory cells, responsive to a number of pages being read during the operation, and reprogram corrected data to the memory cells if errors are found in the additional portions, wherein the number of pages is a total number of pages accumulated over a plurality of power cycles and a different portion of the memory is checked for errors in response to each power on.

10. The apparatus of claim 9, wherein the array of nonvolatile memory comprises a NAND flash memory.

11. The apparatus of claim 9, wherein the controller is further operable to determine whether a portion of the memory is marked for refresh in response to the at least a portion of the apparatus being powered on, and to refresh the portion of memory if the controller determines that the portion is marked for refresh.

12. The apparatus of claim 9, wherein the controller being operable to check the portion of the memory cells for errors comprises the controller being operable to use error correction code data associated with the user data read from the portion of the memory cells to determine whether errors are present in the read user data.

13. The apparatus of claim 9, wherein the controller being operable to reprogram corrected data comprises the controller being operable to reprogram data corrected data to the memory cells if the errors found exceed an error threshold.

14. The apparatus of claim 9, further comprising a stored refresh block pointer identifying a block of the memory not yet checked for errors.

15. The apparatus of claim 9, wherein the controller being operable to reprogram the portion of nonvolatile memory comprises the controller being further operable to store a marker indicating the portion of the memory for refresh, copy the portion of memory, reprogram the data to the memory, and remove the stored marker indicating the portion of memory when reprogramming is complete.

16. The apparatus of claim 9, wherein the array of memory cells comprises an array of multi-level memory cells.

17. A controller operable to check a portion of a non-volatile memory for errors in response to the controller being powered on, and to refresh the portion of the memory in response to errors found in checking the portion for errors, the controller being further operable to check additional portions of the memory for errors, during operation of the memory cells, responsive to a number of pages being read during the operation, and refresh the additional portions in response to errors found in the additional portions, wherein the number of pages is a total number of pages accumulated over a plurality of power cycles and a different portion of the memory is checked in response to each power on.

18. The controller of claim 17, wherein the controller is further operable to determine whether the portion of the memory is marked for refresh in response to being powered on, and to refresh the portion of the memory if it is marked.

19. The controller of claim 17, wherein the controller is further operable to apply an error correction code to the read portion of nonvolatile memory to detect presence of the errors and to remove the errors from the portion of nonvolatile memory.

20. The controller of claim 17, wherein the controller is further operable to mark the portion of nonvolatile memory for refresh, copy the portion of nonvolatile memory, correct the errors found in the portion of memory, reprogram corrected data to the memory, and unmark the portion of memory.

21. The controller of claim 17, wherein the controller is further operable to check the memory for errors as a background method while the memory is available for normal access operations.

22. The controller of claim 21, wherein the controller is operable to check the nonvolatile memory device for errors as a background process based on a number of memory pages read.

23. The controller of claim 17, wherein the controller is operable to refresh the portion of the nonvolatile memory only if found errors exceed an error threshold.

24. An apparatus, comprising:
a controller operable to check a portion of a non-volatile memory for errors in response to at least a portion of the apparatus being powered on, and refresh the portion of the memory in response to errors found in checking the portion of the memory for errors, the controller being further operable to check additional portions of the memory for errors, during operation of the memory cells, based on a number of memory pages being read during the operation, and refresh the additional portions of the memory in response to errors found in checking the additional portions, wherein the number of pages is a total number of pages accumulated over a plurality of power cycles and a different portion of the memory is checked in response to each power on.

25. The apparatus of claim 24, further comprising a memory device including the memory.

26. The apparatus of claim 25, wherein the memory device comprises a flash memory card.

27. The apparatus of claim 24, wherein the controller is further operable to determine whether a portion of the memory is marked for refresh and to refresh the marked portion of the memory in response to the at least a portion of the apparatus being powered on.

28. The apparatus of claim 24, wherein the controller is further operable to mark the portion of the memory as needing to be refreshed, copy data of the portion of memory, and correct any correctable errors in the portion of memory, reprogram the corrected data to the memory, and unmark the portion of memory as needing to be refreshed.

29. The apparatus of claim 24, wherein the apparatus comprises a portable gaming device, a smart phone, a digital camera, a personal digital assistant, a solid state flash drive, or a computer.

30. A method, comprising:
checking a portion of non-volatile memory of a non-volatile memory device for errors in response to the memory device being powered on, wherein a different portion of the memory is checked in response to each power on;
checking additional portions of the memory for errors, during operation of the memory, after a predetermined number of pages of the memory have been read wherein the predetermined number of pages is a total number of pages accumulated over a plurality of power cycles; and
when errors are found, refreshing the portions of memory comprising the errors.

31. The method of claim 30, wherein checking the portion of the memory for errors comprises checking a marker identifying a portion of the memory that needs to be refreshed in response to powering on the memory device.

32. The method of claim 30, further comprising storing a refresh block pointer identifying a memory block to be checked for read errors in the memory device, and storing a refresh page pointer identifying a memory page to be checked for read errors in the memory block.

33. A method comprising:
responsive to powering on a non-volatile memory device, reading data of an identified block of memory of the memory device;
checking additional portions of the memory for errors, during operation of the memory, after a predetermined number of pages of the memory have been read wherein the predetermined number of pages is a total number of pages accumulated over a plurality of power cycles, wherein different blocks of memory or different additional portions of the memory are checked in response to each power on;
determining whether the read data of the identified block of memory or the additional portions of the memory includes a number of errors exceeding a threshold; and
if the number of errors exceeds the threshold, marking the identified block or the additional portions of the memory for refresh.

34. The method of claim 33, further comprising, prior to reading data of the identified block, determining whether a block of memory of the memory device is already marked for refresh and, if a block is already marked for refresh, refreshing the already marked block.

35. The method of claim 34, wherein the data of the identified block is only read if no block is already marked for refresh.

36. The method of claim 34, wherein reading the data of the identified block is further responsive to refreshing the already marked block.

37. The method of claim 34, wherein determining whether a block of memory is already marked for refresh comprises checking a location in nonvolatile memory.

38. The method of claim 34, wherein determining whether a block of memory is already marked for refresh comprises checking a flag associated with the block of memory.

39. The method of claim 33, further comprising refreshing the identified block responsive to marking the identified block for refresh.

40. The method of claim 39, wherein refreshing the identified block comprises copying the data of the identified block and reprogramming the data of the identified block.

41. The method of claim 39, wherein refreshing the identified block comprises:
copying the data of the identified block;
correcting correctable errors in the copied data; and
reprogramming the corrected data.

42. The method of claim 33, wherein determining whether the read data of the identified block of memory includes a number of errors exceeding a threshold comprises counting a number of errors per page of data read from the identified block.

43. The method of claim 33, wherein reading data of an identified block of memory of the memory device comprises looking up a pointer to a pre-identified block responsive to powering on the memory device and then reading data of the identified block.

44. The method of claim 43, further comprising changing a block identified by the pointer responsive to refreshing the identified block.

45. The method of claim 33, wherein reading data of an identified block of memory of the memory device comprises reading data of a single identified block of memory.

46. The method of claim 33, wherein determining whether the read data of the identified block of memory includes a number of errors exceeding a threshold comprises determining whether a number of errors in any page of data read from the identified block exceeds the threshold.

* * * * *